(12) United States Patent
Nakamura

(10) Patent No.: US 6,211,936 B1
(45) Date of Patent: Apr. 3, 2001

(54) LIQUID CRYSTAL DISPLAY DEVICE AND METHOD OF MAKING THE SAME

(75) Inventor: Teruya Nakamura, Saitama-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/330,130

(22) Filed: Jun. 11, 1999

(30) Foreign Application Priority Data

Jun. 16, 1998 (JP) .................................................. 10-168162

(51) Int. Cl.[7] .................................................. G02F 1/1345

(52) U.S. Cl. ........................... 349/152; 349/149; 349/150

(58) Field of Search .................................... 349/149, 150, 349/151, 152

(56) References Cited

U.S. PATENT DOCUMENTS

| 4,985,663 | * | 1/1991 | Nakatani | 349/150 |
| 5,089,750 | * | 2/1992 | Hatada et al. | 349/150 |
| 5,668,700 | * | 9/1997 | Tagusa et al. | 349/150 |

FOREIGN PATENT DOCUMENTS 8-271925  10/1996  (JP) .

* cited by examiner

*Primary Examiner*—James A. Dudek
(74) *Attorney, Agent, or Firm*—Pillsbury Winthrop LLP

(57) ABSTRACT

A liquid crystal display panel is provided with an array circuit substrate, a counter substrate, and a liquid crystal material held between the substrates. Signal line terminals are disposed at an edge portion of the circuit array substrate. A flexible printed circuit board includes a base film and a signal line layer put along the base film. The signal line layer of the flexible printed circuit board is thermally pressure-contacted to the terminals of the circuit array substrate through an electrically anisotropic conductive film. The anisotropic conductive film has a connecting portion and an extra portion extending from the connecting portion. Such thermally pressure-contacting is carried out by applying a hot press tool to the flexible printed circuit board. A support member is formed out of the connecting portion of the anisotropic conductive film at the edge portion of the array substrate. The support member substantially avoids interference between the flexible printed circuit board and the array substrate. It also prevents the flexible printed circuit from being broken. A protection layer is also made of the extra portion of the anisotropic film to protect the signal line layer of the flexible printed circuit board.

4 Claims, 4 Drawing Sheets

LIQUID CRYSTAL DISPLAY DEVICE AND METHOD OF MAKING THE SAME

BACKGROUND OF THE INVENTION

FIELD OF THE INVENTION

This invention relates to a liquid crystal display device in which a flexible printed circuit board is thermally pressure-contacted to a liquid crystal display panel through an electrically anisotropic film, and to a method of making the same.

A liquid crystal display device is thin in thickness and light in weight so that it has been widely used for various small-size, hand-held-type data processing equipment. As shown in FIG. 7, a liquid crystal device includes a liquid crystal display panel 16 which consists of a circuit array substrate 11, a counter substrate 12 provided opposite to the array substrate 11 and a liquid crystal material (not shown) located between the array and counter substrates 11 and 12. On the array substrate 11, scanning and signal lines (not shown) are disposed to cross each other at a right angle, and pixel electrodes and switching circuits to supply video signals to the electrodes are provided in the vicinities of the cross points of the scanning and signal lines. The scanning and signal lines are coupled to electrically connecting terminals 15 at an edge portion of the array substrate 11 in order to supply signals to, and to derive signals from, the liquid crystal display panel 16. A common electrode is provided on the counter electrode 12. Polarizers 13 and 14 are attached to outer surfaces of the array and counter substrates 11 and 12, respectively. In a driver-monolithic-type liquid crystal display panel, however, driver circuits are disposed at surrounding areas of an image forming region in the array substrate.

A flexible printed circuit board ("FPC") 61 consists of a base film 1, an adhesive layer 2 applied on the base film 1, a printed signal line layer 3 made of copper foil along a surface of the layer 2, and a protective film 4 to protect the signal line layer 3. An electrically anisotropic conductive film ("ACF") 52 is provided to connect the terminals 15 to the FPC 61. The ACF 52 is made of a thermosetting isolation layer and electrically conductive particles dispersed in the isolation layer. The signal line layer 3 is thermally pressure-contacted to the terminals 15 through the ACF 52 at the edge portion of the array substrate 11.

Since the array substrate 11 has a sharp edge 50 as shown in FIG. 5, the signal line layer 3 of the FPC 61 is often broken by the edge 50 during their assembling process. To avoid this, an additional process is required to cut it out to form a slope 51 as shown in FIG. 6.

Since the signal line 3 is not entirely covered with the protective film 4, it may be still damaged during the assembling process.

SUMMARY OF THE INVENTION

An object of the present invention is to provide a liquid crystal display device with a structure to eliminate the edge-cutting process and a method of making the same. An object of the invention is to provide a liquid crystal display device which is capable of preventing an FPC (flexible printed circuit board) from being broken and a method of making the same.

According to one aspect of the invention, a liquid crystal display device includes a liquid crystal display panel provided with two opposite electrode substrates and a liquid crystal material put between the electrode substrates. One of the electrode substrates has a plurality of electrically connecting terminals at its edge portion. The terminals are connected to a signal line layer of an FPC through an ACF (electrically anisotropic conductive film). The ACF is made of a thermosrtting isolation layer and electrically conductive particles dispersed therein. The ACF has a connecting portion for the terminals and the FPC and an extending portion therefrom. Thus, when the FPC, the ACF and the terminal are thermally pressured, the signal line layer of the FPC is connected to the terminals through the ACF. During this process, the connecting portion of the ACF is pushed out, gradually becomes solid and forms a support member at the edge of the electrode substrate. The support member is semicircular in shape due to the surface tension of the ACF.

The support member avoids interference between the edge of the electrode substrate and the signal line layer of the FPC. The support member also prevents the FPC from being broken when the FPC is bent around the edge of the electrode substrate. Further, the extending portion of the ACF entirely covers the signal line layer and protect it after turning into a solid.

According to another aspect of the present invention, a method of making a liquid crystal display device includes a thermally pressure-connecting process by which a liquid crystal display panel is connected to an FPC through an ACF. The liquid crystal display panel includes two opposite electrodes and a liquid crystal material held between them. One of the electrode substrates has a plurality of electrically connecting terminals. The FPC includes a signal line layer. The ACF is made of a thermosetting isolation layer and electrically conductive particles dispersed therein. The ACF has an ordinary portion to connect the terminals of the electrode substrate to the signal line layer of the FPC and an extra portion extending therefrom. After the FPC and the ACF are set in alignment with the terminals, those components are thermally pressure-connected to each other by applying a hot press tool. The connecting portion of the ACF is pushed out, becomes semicircular in shape at the edge of the electrode substrate due to surface tension, grows gradually solid, and finally forms a support member for the FPC and the edge. At the same time the extending portion of the ACF is hardened and protects the signal layer of the FPC. Thus, this method of making the liquid crystal display device does not require the carrying out of the conventional process to cut out the edge portion of the electrode substrate.

The above-stated and other objects and advantages of the invention will become apparent from the following description when taken with the accompanying drawings. It will be understood, however, that the drawings are for purposes of illustration and not to be construed as defining the scope or limits of the invention, reference being had for the latter purpose to the claims appended hereto.

BRIEF DESCRIPTION OF THE DRAWINGS

In the drawings wherein like reference characters denote like parts in the several views.

DETAILED DESCRIPTION OF THE INVENTION

An embodiment of the present invention will be hereinafter explained with reference to the drawings.

Figure 1:
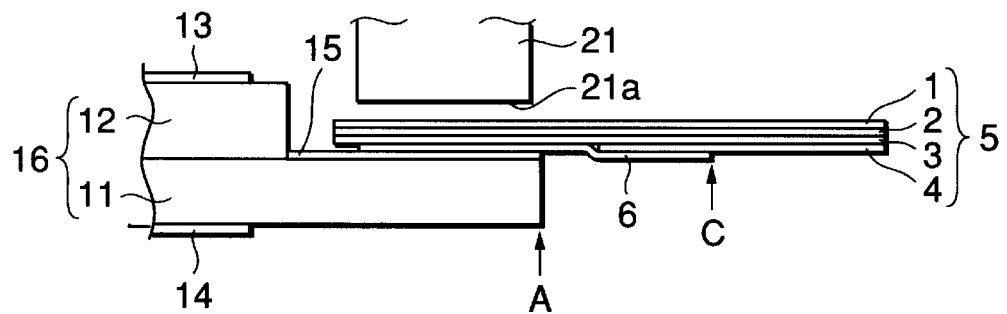
FIG. 1 is a schematic partial side view of a liquid crystal display device and a hot press tool of the present invention.

FIG. 1 shows an embodiment of a liquid crystal display device and a method of making the same in accordance with this invention. A liquid crystal display device includes a liquid crystal display panel 16. The panel 16 is provided with first and second electrode substrates 11 and 12 disposed opposite to each other. Those components are the circuit array and counter substrates, respectively. The substrates 11 and 12 hold a liquid crystal composition (not shown) located between them. On the array substrate 11, scanning and signal lines (not shown) are disposed to cross each other at a right angle. Pixel electrodes, and switching elements to supply video signals to the electrodes are provided in the vicinities of the crossing points of the scanning and signal lines. A common electrode is disposed on the counter substrate 12. Polarizers 13 and 14 are attached to outer surfaces of the substrates 11 and 12, respectively. Connecting terminals 15 are disposed at an edge portion of the array substrate 11. Further, driver circuits are disposed in surrounding areas of a image forming region in the panel in the case of a driver-monolithic type liquid crystal display panel.

An FPC 5 consists of a base film 1, an adhesive layer 2, a signal line layer 3, and a protective film 4. An ACF 6 is made of a thermosetting isolation layer and electrically conductive particles dispersed therein. The ACF 6 has an ordinary portion to connect the terminals 15 of the array substrate 11 to the signal line layer 3 of the FPC 5, and an extra portion to extend from an edge A of the array substrate 11 to a portion C of the protective film 4.

Figure 2:
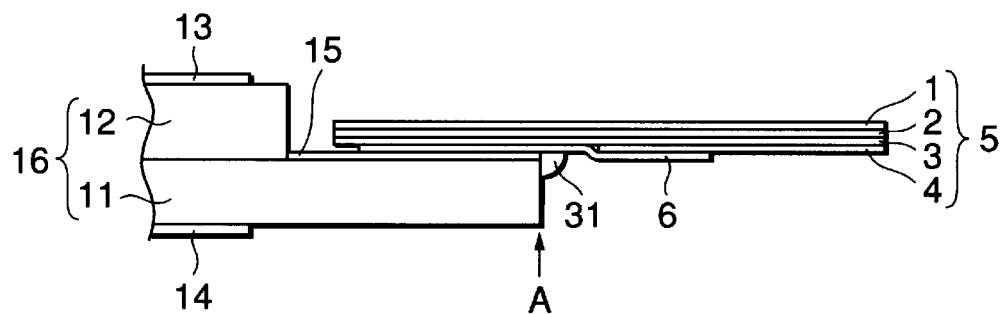
FIG. 2 is a schematic partial side view of the liquid crystal display device of the invention in which a liquid crystal panel is thermally pressure-contacted to an FPC by using the hot press tool.

In an assembling process of the liquid crystal display device, the signal line layer 3 of the FPC 5 and the ACF are set in alignment with the terminals 15. A hot press tool 21, then, pushes the FPC 5, the ACF 6 and the terminals 15 for a predetermine period of time. It is desirable to use the hot press tool 21 whose contact surface 21a is wide enough to cover the ACF 6 as shown in FIG. 1. By applying the hot press tool 21 to the FPC 5, the ACF 6, and the terminals 15, those components are thermally pressure-connected to each other. The connecting portion of the ACF 6 is pushed out, becomes semicircular in shape at the edge of the array substrate 11 due to surface tension, grows gradually solid, and finally forms a support member 31 for the FPC 5 the edge of the array substrate 11 as shown in FIG. 2. In addition, the extending portion of the ACF hardens to form a protection layer for the signal line layer 3.

Figure 3:
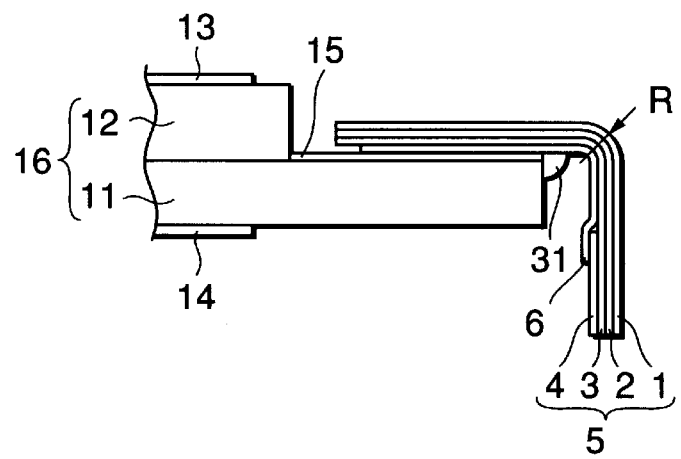
FIG. 3 is a schematic partial side view of the liquid crystal display device of the invention in which the FPC is bent around an edge of the panel.

When the FPC 5 is bent inwardly or folded in assembling components or for transportation, the support member 31 makes it easier. In addition, since the FPC 5 is bent inwardly or folded around the support member 31 at a curvature radius R as shown in FIG. 3, the support member 31 eases stresses due to such bending and folding so that it prevents the signal line layer 3 of the FPC 5 from being broken.

Figure 6:
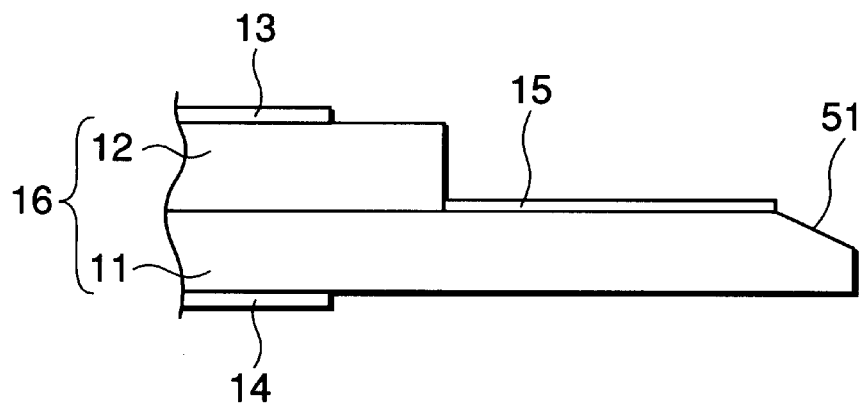
FIG. 6 is a schematic partial side view of a conventional liquid crystal display panel of which an edge is cut off to form a slope.
Figure 7:
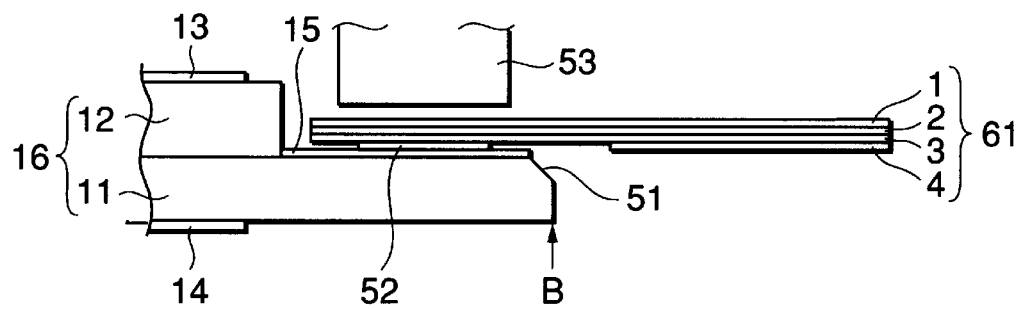
FIG. 7 is a schematic partial side view of the conventional liquid crystal display panel shown in FIG. 6, a FPC, and a hot press tool.
Figure 8:
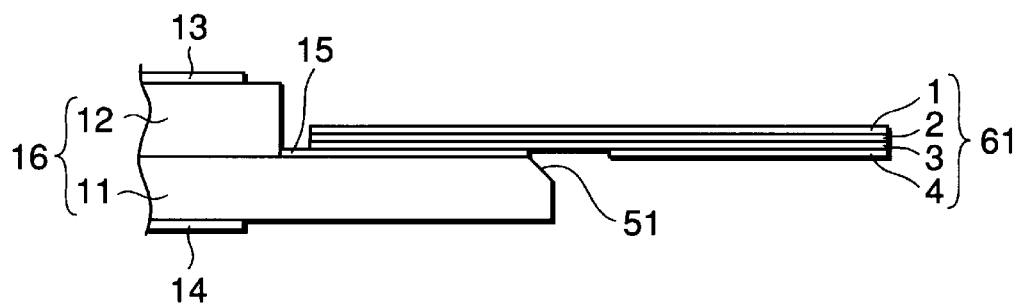
FIG. 8 is a schematic partial side view of a conventional liquid crystal display device in which the FPC is thermally pressure-connected to the panel shown in FIG. 6 by using the hot press tool.
Figure 9:
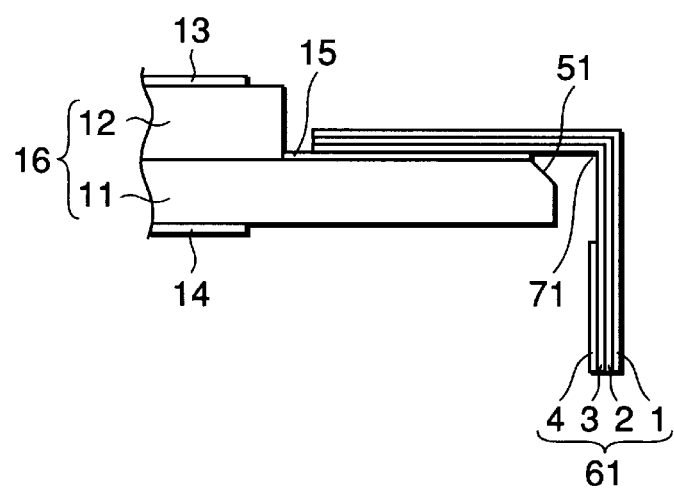
FIG. 9 is a schematic partial side view of the conventional liquid crystal display device.

Further, since the edge of the panel 16 does not interfere with the signal line layer 3 by means of the support member 31, such a cut-out portion 51 as shown in FIG. 6 is no longer necessary and the step for cutting it out can be eliminated. Thus, the number of manufacturing steps is reduced.

As described above, the embodiment prevents the signal line layer 3 from being broken so that its production yield is significantly improved. At the same time, since it is not necessary to define a slope at the edge of the panel 16, the manufacturing cost can be reduced.

Figure 4:
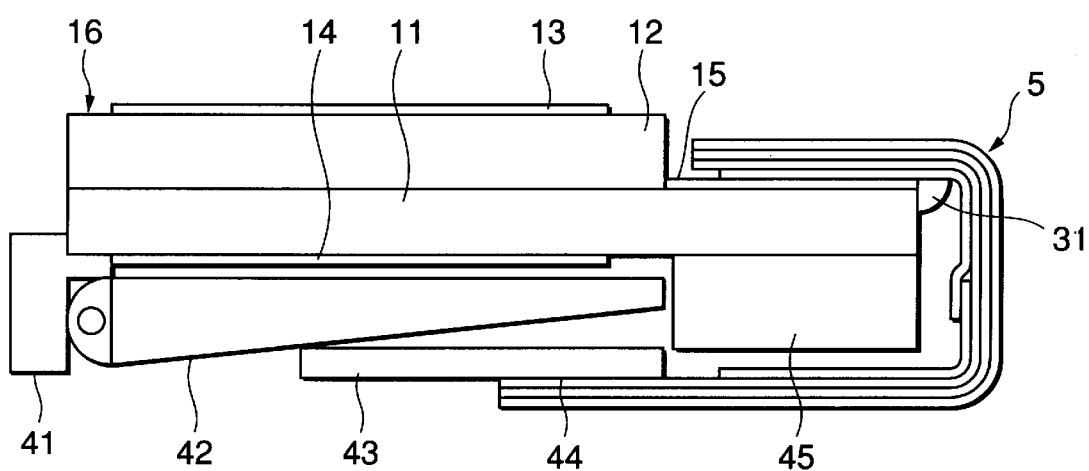
FIG. 4 is a schematic side view of the liquid crystal display device of the invention in which a frame, an illumination light source, and the FPC are assembled.
Figure 5:
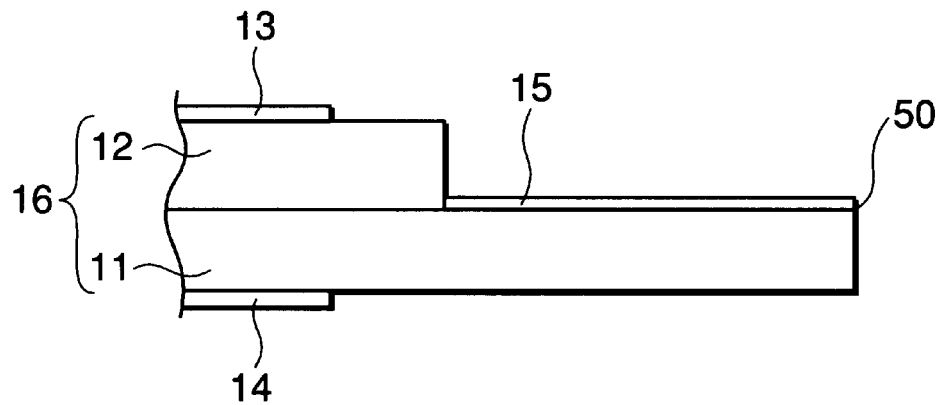
FIG. 5 is a schematic partial side view of a conventional liquid crystal display panel.

FIG. 4 schematically shows the structure of an assembled liquid crystal display device. The panel 16 is supported on a front surface of frames 41 and 45 while an illumination light source unit 42 and a printed circuit board 43 are held between the frames 41 and 45. The FPC 5 thermally pressure-connected to the connecting terminals 15 is folded inwardly around the support member 31 at the edge of the panel 16. The FPC 5 is further folded inwardly around a lower edge of the frame 45 and an ACF 44 is also thermally pressure-connected to the printed circuit board 43.

Next, materials and thickness data of the components will be described by way of example. The base film 1 of the FPC 5 is made of a 25 $\mu$m-thick polyimide resin. On the base film 1, an epoxidation resin is applied to make an approximately 10 $\mu$m-thick adhesive layer 2. The signal line layer 3 consists of an approximately 18 $\mu$m-thick electrolytic copper foil. The cover film 4 formed on the signal line layer 3 is made of a 25 $\mu$m-thick polyimide resin to protect the signal line layer 3 from the edge portion of the panel 16.

The ACF 6 is made of an approximately 25 $\mu$m-thick epoxy system thermosetting resin in which 5–10 $\mu$m diameter metal balls or metal-coated plastic balls are dispersed as the conductive particles. The ACF 6 is 2.5 mm in length at the portion connected to the terminals 15, 0.1 mm in terminal pitch, and 50 in terminal number in the case where the terminals 15 of the panel 16 are 2.0 mm long at the connected portion, 0.1 mm in terminal pitch, and 50 in terminal number. The ACF 6 is 3.0 mm in width (in the direction perpendicular to the paper surface) and 5.0 mm in length (in the direction from the right to left shown in FIG. 1). The ACF 6 is put along the signal line 3 and the cover film 4 up to the location C as shown in FIG. 1. The hot press tool 21 is 3.3 mm in width and 5.4 mm in length.

The thermally pressure-connecting process is carried out in the following steps. First, a semi-solid ACF 6 is applied to cover the signal line layer 3 and the cover film 4. Secondly, the connecting portion of the signal line layer 3 is aligned with that of the terminals 15. Finally, the hot press tool 21 heats and pressure-connects the ACF 6 in order for the ACF to connect the FPC 5 to the terminals 15. The processing conditions are as follows: the heating temperature for the ACF 6, 180° C.±10° C.; the pressure, 35 kg/cm$^2$±5 kg/cm$^2$; and the processing time, 20 sec. or more.

As different embodiments of this invention may be made without departing from the spirit and scope thereof, it is to be understood that the invention is not limited to its specific embodiments described herein. The structure or material of components such as a panel and an FPC, for example, may be different from that of those shown in FIG. 1 insofar as an anisotopic conductive film melts and makes a support member at an edge portion of a panel by applying a thermally pressure-connecting process thereto.

As described above, since a liquid crystal display device of the present invention includes a liquid crystal display panel, an FPC, and an ACF provided with an ordinary portion to thermally pressure-contact the FPC to terminals of the panel and an extra portion extending therefrom, a support member for the FPC and the terminals of the panel can be easily formed at an edge of the panel without an edge-cutting process. The edge of the panel, though present, still does not interfere with the FPC. During the same thermally pressure-contacting process, the extending portion of the ACF hardens to form a protection film for the signal line layer of the FPC. Further, when the FPC is bent around the edge of the panel, the structure of the liquid crystal display device in accordance with the present invention and method of making the same prevent the FPC from being broken and its production yield can be improved.

What I claim is:

1. A liquid crystal display device, comprising:

a liquid crystal panel including first and second electrode substrates provided opposite to each other and a liquid crystal material held between said electrode substrates;

terminals disposed at an edge portion of said first electrode substrate;

a flexible printed circuit board including a base film and a signal line layer put along said base film;

an electrically anisotropic conductive film made of a thermosetting isolation resin and electrically conductive particles dispersed therein;

said anisotropic film including a connecting portion to connect said signal line layer of said flexible printed circuit board to said terminals at the edge portion of said panel and an extra portion extending from said connecting portion;

a support member formed out of said connecting portion of said anisotropic conductive film at said edge portion of said first substrate when said flexible printed circuit, said connecting portion of said anisotropic conductive film, and said terminals of said first electrode substrate are processed to be thermally pressure-contacted to each other; and a protection layer formed by said extra portion of said anisotropic film to protect said signal line layer of said flexible printed circuit board during said thermally pressure contacting process.

2. The liquid crystal display device according to claim 1, wherein said flexible printed circuit board is bent around said support member.

3. A method of making a liquid crystal display device, comprising the steps of:

assembling a first electrode substrate having terminals at its edge portion, a second electrode substrate opposite to said first electrode substrate, and a liquid crystal material held between said first and second electrode substrates into a liquid crystal display device;

preparing a flexible printed circuit board including a base film and a signal line layer put along said base film, and an anisotropic conductive film made of a thermosetting isolation resin and electrically conductive particles dispersed in said isolation resin, said anisotropic conductive film having a connecting portion and an extra portion extending from said connecting portion;

aligning said signal line layer of said flexible printed circuit board with said connecting portion of said anisotropic conductive film and said terminals of said first electrode substrate;

thermally pressure-contacting said signal layer of said flexible printed circuit board to said terminals of said first electrode substrate through said connecting portion of said anisotropic conductive film;

forming a support member out of said connecting portion of said flexible printed circuit board at said edge portion of said first electrode substrate during said thermally pressure-contacting step; and making a protection layer out of said extraportion of said anisotropic film during said thermally pressure-contacting step.

4. The method of making a liquid crystal display device according to claim 3, wherein said thermally pressure-contacting step is carried out by applying a hot press tool to said signal line layer of said flexible printed circuit board which has been aligned with said anisotropic conductive film and said terminals of said first electrode substrate in said aligning step.

* * * * *